(12) United States Patent
Shiraishi et al.

(10) Patent No.: US 8,878,687 B2
(45) Date of Patent: Nov. 4, 2014

(54) AUTOMATIC DOOR SENSOR AND FUNCTIONALITY EXPANSION MODULE FOR USE IN THE SAME

(75) Inventors: Masanao Shiraishi, Otsu (JP); Takashi Imai, Otsu (JP); Takashi Kondo, Otsu (JP); Takayasu Ikeda, Otsu (JP); Yohei Iwata, Otsu (JP)

(73) Assignee: Optex Co., Ltd., Shiga (JP)

( * ) Notice: Subject to any disclaimer, the term of this patent is extended or adjusted under 35 U.S.C. 154(b) by 22 days.

(21) Appl. No.: 13/881,809

(22) PCT Filed: Oct. 27, 2011

(86) PCT No.: PCT/JP2011/074758
§ 371 (c)(1),
(2), (4) Date: Apr. 26, 2013

(87) PCT Pub. No.: WO2012/057245
PCT Pub. Date: May 3, 2012

(65) Prior Publication Data
US 2013/0214930 A1    Aug. 22, 2013

(30) Foreign Application Priority Data
Oct. 29, 2010   (JP) ................................. 2010-243633

(51) Int. Cl.
| G08B 21/00 | (2006.01) |
| H05K 5/00 | (2006.01) |
| G08B 5/00 | (2006.01) |
| G01V 8/20 | (2006.01) |
| E05F 15/00 | (2006.01) |
| E05F 15/20 | (2006.01) |

(52) U.S. Cl.
CPC .............. *G08B 5/00* (2013.01); *H05K 5/0021* (2013.01); *E05F 15/0026* (2013.01); *E05F 15/203* (2013.01); *G01V 8/20* (2013.01); *E05Y 2900/132* (2013.01)

USPC ............................................ 340/693.6; 49/25

(58) Field of Classification Search
USPC ........ 340/693.5, 693.6, 693.9; 49/25, 26, 507
See application file for complete search history.

(56) References Cited

U.S. PATENT DOCUMENTS
6,782,660 B2 *   8/2004   Takada et al. ..................... 49/25

FOREIGN PATENT DOCUMENTS

| JP | 2006-234526 | 9/2006 |
| JP | 2006-245008 | 9/2006 |
| JP | 2007-138435 | 6/2007 |
| JP | 2009-92536 | 4/2009 |
| JP | 2009-264089 | 11/2009 |

OTHER PUBLICATIONS

International Search Report issued Dec. 13, 2011 in International (PCT) Application No. PCT/JP2011/074758.

* cited by examiner

*Primary Examiner* — Jeffery Hofsass
(74) *Attorney, Agent, or Firm* — Wenderoth, Lind & Ponack, L.L.P.

(57) ABSTRACT

An automatic door sensor includes: at least one sensor module unit (sensor module 11) configured to detect optically an object or a human body and to output, according to the detection results, a signal to a door controller for controlling an automatic door to open/close; an accommodation unit (profile 12) capable of accommodating the at least one sensor module unit; a cover member (front cover 13) that is transmissive to light for use for the detection performed by the sensor module unit and configured to cover the accommodation unit in which the sensor module unit is accommodated; and a functionality expansion module (LED module 14) either side of which can be joined to the cover member and that is configured to expand functionalities of the automatic door sensor by performing communication with the sensor module unit.

20 Claims, 7 Drawing Sheets

AUTOMATIC DOOR SENSOR AND FUNCTIONALITY EXPANSION MODULE FOR USE IN THE SAME

TECHNICAL FIELD

The present invention relates to automatic door sensors installed on an upper portion of an automatic swing door apparatus or the like, and in particular to an automatic door sensor whose functionalities can be easily expanded, while maintaining integrity of the automatic door sensor, and a functionality expansion module for use in the automatic door sensor.

BACKGROUND ART

Conventionally, as an automatic door sensor installed on an upper portion of a so-called automatic swing door apparatus or the like, a triangulation system safety sensor, for example, has been used (see, for example, Patent Document 1). FIG. 8 is a schematic diagram illustrating an example of installation of such a triangulation safety sensor 110 on a swing door 120.

As illustrated in FIG. 8, the triangulation safety sensor 110 ordinarily has a tubular shape, and a sensor module unit (not shown) for detecting a human body or the like is accommodated at an appropriate location within the triangulation safety sensor 110.

In order to ensure safety on an edge (door end) 120a side of the swing door 120, the sensor module unit needs to be arranged near the edge 120a of the swing door 120. Meanwhile, a wiring 121 to a door controller for controlling the swing door 120 to open or close has to be arranged on a hinge side 120b of the swing door 120. In order to prevent, as much as possible, this wiring 121 from being unsightly due to being exposed to the outside, the wiring 121 from the sensor module unit arranged near the edge 120a of the swing door 120 should be covered and hidden as much as possible. This is the reason why the triangulation safety sensor 110 as a whole has preferably a tubular shape.

Also, in order to ensure safety in locations other than the edge 120a of the swing door 120, a sensor module unit may additionally be arranged near the center or the like of the swing door 120. Also in such a case, the triangulation safety sensor 110 having a tubular shape as a whole is advantageous in allowing freedom of arrangement of the sensor module units.

Conversely, however, irrespective of the location on the swing door 120 where the sensor module unit is arranged, the sensor module unit needs to be covered with a detection window 113 that serves also as a front cover. Consequently, the detection window 113 has to be configured to have a length that is substantially the same as the length of the tube of the entire triangulation safety sensor 110.

Such a triangulation safety sensor 110 has features with respect to the following problems.

(1) With Respect to an Operation Indicator Light:

In such a triangulation safety sensor 110, an operation indicator light for indicating operations of a sensor module unit is often provided on the sensor module unit itself.

However, since the number and locations of the sensor module units to be arranged in the triangulation safety sensor 110 have not been fixed in advance, the triangulation safety sensor 110 is often not provided with an operation indicator light on an external surface thereof.

(2) With Respect to an Adjustment Work for Setting a Distance or the Like:

Since manipulation units (such as DIP switches) for configuring various types of settings of the triangulation safety sensor 110 are ordinarily provided on the sensor module unit, operations for configuring various types of settings, adjustment works, or the like are performed, with the detection window 113 being removed from the triangulation safety sensor 110.

There are various setting items for the triangulation safety sensor 110 and, besides, adjustment for causing the triangulation safety sensor 110 to learn a distance setting (a cancellation distance from a floor 123) is needed as long as a safety sensor is a triangulation sensor. After this distance setting has been configured, the triangulation safety sensor 110 is covered with the detection window 113, and therefore, in order to perform readjustment for causing the triangulation safety sensor 110 to learn a distance, the detection window 113 has to be removed again, resulting in very troublesome works.

Examples of a conventional technology for simplifying such an adjustment work and the like include an "automatic door adjustment device" described in Patent Document 2, for example. This "automatic door adjustment device", however, needs not only to include additionally a handy terminal 2 but also to enable an automatic door control device 16 for controlling the door 6 to open or close to intercommunicate with the handy terminal 2. This thus makes the overall configuration of the "automatic door adjustment device" complicated and can cause a significant increase in cost.

(3) With respect to the case where there is a wall or the like in a direction in which the door opens:

In the case where the triangulation safety sensor 110 is arranged on the side in which the swing door 120 opens, the triangulation safety sensor 110 controls, upon having detected the presence of a human body or an object, the swing door 120 to remain closed or to stop immediately even in the process of opening.

However, as illustrated in FIG. 8, in the case where there is a wall 122 or the like at a location where the swing door 120 fully opens, the triangulation safety sensor 110 detects the wall 122 when the swing door 120 opens at a predetermined angle, so that a defect will occur in which the swing door 120 does not fully open. In order to prevent this defect, conventionally, for example, a door controller determines to cancel a detection signal indicating detection of an object or the like by the triangulation safety sensor 110 when the swing door 120 reaches the predetermined angle, and thereby performs control so that the swing door 120 can fully open.

However, there are some types of door controllers that cannot perform such control. Therefore, adopting another method for performing control is needed such that a detection signal from the triangulation safety sensor 110 is not transmitted to the door controller when the door reaches a predetermined angle (for example, a magnet switch is released when the swing door 120 reaches the predetermined angle so that a detection signal is not output).

PRIOR ART DOCUMENT

Patent Document

[Patent Document 1] JP 2009-264089A
[Patent Document 2] JP 2007-138435A

SUMMARY OF INVENTION

Problem to be Solved by the Invention

The above-described triangulation safety sensor 110 of the conventional technology has the following problems (1) to (3). Note that these numbers respectively correspond to the above-described numbers in the description of Background Art.

(1) Poor Visibility of an Operation Indicator Light:

Since the triangulation safety sensor 110 uses infra-red rays, the detection window 113 has characteristics of an infra-red transparent filter in order to reduce an influence of ambient light and to hide internal structures thereof. Therefore, visible rays are basically not transmitted.

Even if the sensor module unit accommodated and arranged within the triangulation safety sensor 110 is provided with, for example, a red LED as an operation indicator light, visibility of red light of the LED, which is a visible light region, is very poor since the red LED is covered with the detection window 113 at the time of operation. Even assuming that the red light is visible, the extent of visibility is such that the red light can only slightly be recognized.

In other words, the LED that indicates operations of the triangulation safety sensor 110 is visible in the state in which the detection window 113 has been removed but hardly visible at the time of actual operation because the LED is covered with the detection window 113.

Therefore, if the triangulation safety sensor 110 had a failure, it would be difficult for a client or a builder to recognize such a failure, and the failure of the triangulation safety sensor 110 will only be revealed when some kind of defect actually occurs.

(2) Adjustment Works for Configuring a Distance Setting are Troublesome:

When a distance setting of the triangulation safety sensor 110 has been configured without the detection window 113 and then the detection window 113 is mounted, some amount of error may occur in the actually learned cancellation distance from the floor 123. If the cancellation distance from the floor 123 is increased due to this error, there may be a case where a standard intended for the adjustment work is not met.

Also, even if there was no particular problem immediately after installation of the triangulation safety sensor 110, a problem may occur in which a change in circumstances or the like of the floor 123 thereafter causes a malfunction or the like. In such a case, a builder needs to be present again at the installation site so as to execute an adjustment procedure.

However, this adjustment procedure is sometimes just a simple work for causing the triangulation safety sensor 110 only to learn a distance again. For example, this adjustment procedure may be a work in which a calibration is performed so as to correct the set cancellation distance. Note that a change in the cancellation distance from the floor 123 itself needs to be set by the builder in view of safety.

The builder has of course a responsibility of going to the installation site to perform a readjustment work. However, if this adjustment work is so simple that even the client can sufficiently execute the adjustment work, the builder desires not to go to the installation site if possible.

(3) Difficulty to Deal with a Case Where the Door Controller has No Detection Cancellation Functionality:

If the door controller has no detection cancellation functionality, some kind of method for performing control such that output of the triangulation safety sensor 110 is not transferred to the door controller is necessary. However, it is quite difficult to detect correctly that the swing door 120 has opened at a predetermined angle, and installation and adjustment works of a magnet switch used therefore, and the like are also troublesome.

In view of such problems in the conventional technology, it is an object of the present invention to provide an automatic door sensor that can easily expand functionality, improve workability, operationality, safety, or the like, and maintain the integrity, aesthetic appearance, and the like as a whole even after the functionality expansion has been performed, and a functionality expansion module for use in the automatic door sensor.

Means for Solving the Problems

In order to attain the above-mentioned object, an automatic door sensor according to the present invention includes: at least one sensor module unit configured to detect optically an object or a human body and to output, according to detection results, a signal to a door controller for controlling an automatic door to open/close; an accommodation unit that is capable of accommodating the at least one sensor module unit; a cover member that is transmissive to light for use for the detection performed by the sensor module unit and configured to cover the accommodation unit in which the sensor module unit is accommodated; and a functionality expansion module either side of which can be joined to the cover member and that is configured to expand functionalities of the automatic door sensor by performing one-way or two-way communication with the sensor module unit.

Also, the automatic door sensor of the present invention may further include: a joining member that can be joined to either side of the functionality expansion module; and a pair of cap portions for closing both ends of the accommodation unit covered with the functionality expansion module one side of which is joined to the cover member and the other side of which is joined to the joining member. The accommodation unit may be capable of internally accommodating the sensor module unit, and the functionality expansion module may be electrically connected to the sensor module unit so as to perform the communication with the sensor module unit.

Also, in the automatic door sensor of the present invention, the accommodation unit may be open at both ends and in a direction of one side, and be capable of accommodating the at least one sensor module unit so as to be arranged in a longitudinal direction thereof, the cover member may have a curved plate shape, and be fittable in the direction of one side of the accommodation unit, the joining member may have substantially a same cross-sectional shape as that of the cover member at least at both ends of the joining member, and have a width that is less than a width of the functionality expansion module, and the functionality expansion module, one side of which is joined to the cover member and the other side of which is joined to the joining member, as a whole may have a length that is substantially a same as a length of the accommodation unit.

According to the automatic door sensor having such a configuration, its functionality is easily expanded, workability, operationality, safety, and the like are improved, and the integrity, aesthetic appearance, and the like of the sensor as a whole are maintained even after the functionality expansion has been performed. The functionality expansion module can be arranged on either one side, i.e., the left end side or the right end side, of the automatic door sensor, so that the level of convenience or the like is also high.

Further, in the automatic door sensor of the present invention, the functionality expansion module may further include a display unit for performing visible display, and the control unit may be configured to control the display performed by the display unit according to a human body or object detection state of the sensor module unit. Also, the control unit may change a mode of display performed by the display unit between a state in which a human body or an object is detected by the automatic door sensor and a state in which no human body or object is detected by the automatic door sensor. Also, the display unit may include a plurality of light emitting elements, and the control unit controls light emission of each of the light emitting elements according to human body or object detection states of a plurality of automatic door sensors. Also, each light emitting element emits light in a variable luminescent color, and the control unit may change the luminescent color of the light emitting element between the state in which a human body or an object is detected by the automatic door sensor and the state in which no human body or object is detected. Here, at least one of the plurality of automatic door sensors may be installed on a surface of a door that is opposite to a surface on which another automatic door sensor is installed.

Also, in the automatic door sensor of the present invention, the functionality expansion module may further include a manipulation unit that is externally manipulatable, and the control unit may cause the sensor module unit to perform a predetermined operation in accordance with a manipulation of the manipulation unit. Here, examples of the predetermined operation include an operation for learning a cancellation distance from a floor at an installation location, but the predetermined operation is not limited to this.

Also, in the automatic door sensor of the present invention, the functionality expansion module may further include a detection unit that is capable of detecting at least one type of information among angular information, positional information, inclination information, and acceleration information, and the control unit may cancel the state in which a human body or an object is detected by the sensor module unit, depending on the information detected by the detection unit. Here, examples of the detection unit include a gyro sensor, but the detection unit is not limited to this.

Note that the present invention also encompasses the functionality expansion module itself for use in an automatic door sensor.

Effects of the Invention

According to an automatic door sensor of the present invention and a functionality expansion module for use therein, its functionality is easily expanded, workability, operationality, safety, and the like are improved, and the integrity, aesthetic appearance, and the like of the sensor as a whole are maintained even after the functionality expansion has been performed. The functionality expansion module can be arranged on either side, i.e., the left end side or the right end side, of the automatic door sensor, so that the level of convenience or the like is also high.

Further, since only the functionality expansion module can be replaced, it is possible to add a desired new functionality while the main body of an automatic door sensor is installed and continuously used, and also easy to use the latest functionality expansion module having an improved functionality.

BRIEF DESCRIPTION OF DRAWINGS

FIG. 1(a) is a front view illustrating an automatic door sensor 10 according to a first embodiment of the present invention, and FIG. 1(b) is a right side view illustrating this automatic door sensor 10.

FIG. 2 is an exploded perspective view illustrating the automatic door sensor 10 viewed upward from a front right lower side.

FIG. 3 is a schematic diagram illustrating an example in which a plurality of sensor modules 11 are accommodated and arranged within the automatic door sensor 10.

FIG. 4 is a block diagram schematically illustrating an electrical configuration of an LED module 14.

FIG. 5 is a block diagram illustrating a schematic configuration in which the automatic door sensors 10 are arranged on both surfaces of the swing door 20.

FIG. 6 is a block diagram schematically illustrating an electrical configuration of a learning manipulation module 14A.

FIG. 7 is a block diagram schematically illustrating an electrical configuration of a door angle detection module 14B.

FIG. 8 is a schematic diagram illustrating an example of installation of a conventional triangulation safety sensor 110 on the swing door 120.

MODE FOR CARRYING OUT THE INVENTION

Hereinafter, embodiments of the present invention will be described with reference to the drawings.

Figure 1:
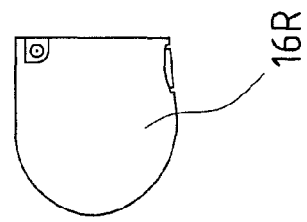
[FIG. 1]
Figure 1:
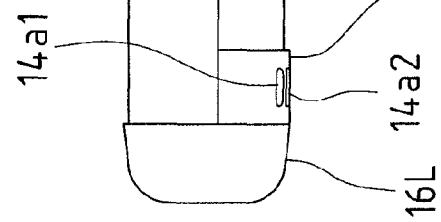
Figure 2:
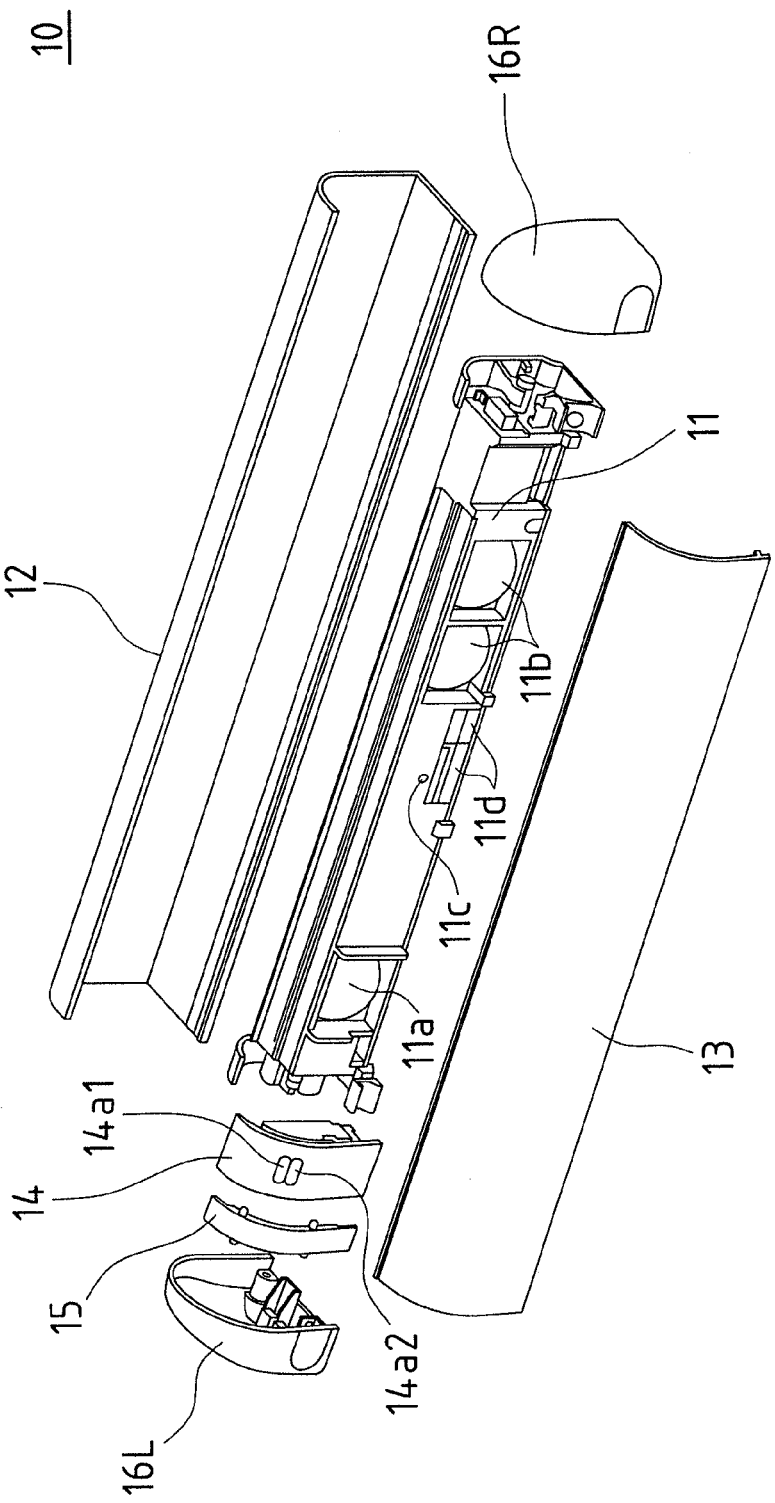
[FIG. 2]
Figure 3:
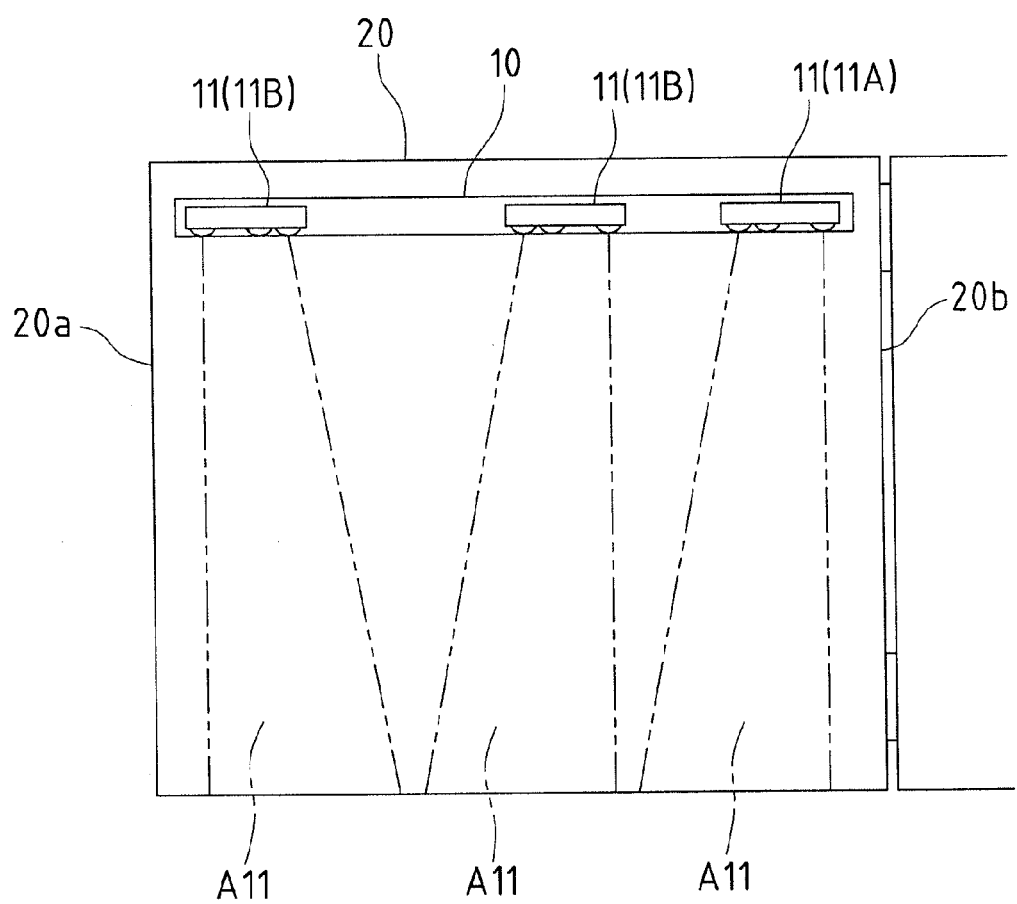
[FIG. 3]

First Embodiment 1.1 Overall Schematic Configuration and an Example of Installation:

FIG. 1(a) is a front view illustrating an automatic door sensor 10 according to the first embodiment of the present invention, and FIG. 1(b) is a right side view illustrating this automatic door sensor 10. FIG. 2 is an exploded perspective view illustrating the automatic door sensor 10 viewed upward from a front right lower side. FIG. 3 is a schematic diagram illustrating an example in which a plurality of sensor modules 11 are accommodated and arranged within the automatic door sensor 10.

As illustrated in FIGS. 1(a), 1(b), and 2, the automatic door sensor 10 is provided with the sensor module 11, a profile 12 serving as an accommodation unit capable of internally accommodating this sensor module 11, a front cover 13 serving as a cover member that is inserted in front of this profile 12, an LED module 14 serving as a functionality expansion module for expanding functionalities of the sensor module 11, a spacer 15, and a left end cover 16L and a right end cover 16R that serve as cap portions for respectively closing both ends of the assembly of these components.

The sensor module 11 optically detects a human body or an object using infra-red rays and output, according to the detection results, a signal to a door controller for controlling an automatic door to open/close.

The sensor module 11 as a whole has a shape of a substantially rectangular column having a horizontally long length, and inside the sensor module 11, an infra-red ray projector (not shown) is arranged in the vicinity of the left end thereof so as to project infra-red rays through a projector lens 11a that is provided in front of the vicinity of the left end of the sensor module 11. If infra-red rays or the like that have been projected outward in such a manner are reflected on a human body or the like and return, the returned infra-red rays or the like pass through a pair of receiving lenses 11b provided in front of the vicinity of the right end of the sensor module 11 to converge, and are received by an infra-red ray receiving unit (not shown) that is provided within the sensor module 11 in the vicinity of the right end thereof. On the basis of the light reception results, a distance to the human body or an object is detected using the triangulation principle.

DIP switches 11d for configuring various settings are provided on the lower front side in approximately the center of the sensor module 11, and an operation displaying LED 11c for displaying an operation state of the sensor module 11 (whether or not an object is present within a range of a predetermined distance) is arranged slightly thereabove.

Note that the term "front" used in the description on the sensor module 11 corresponds to a "near side" of FIG. 2, but at the time of actual installation, the sensor module 11 is directed downward as illustrated in FIG. 3.

The profile 12 is molded by, for example, aluminium extrusion and is open at both ends and in the front side direction. The profile 12 is mounted to an upper portion of the swing door 20 or the like that is an installation location, for example, by screws being fitted in holes, for example, drilled, in the back surface of the profile 12.

The profile 12 is capable of internally accommodating the sensor module 11 such that the projector lens 11a and the pair of receiving lenses 11b and 11c are directed downward from the installation location of the automatic door sensor 10. Rail portions in which the front cover 13 is fitted are respectively provided inside of the upper and lower ends of the profile 12.

Although, in FIG. 2, the length of the profile 12 is shown as being slightly longer than that of the sensor module 11, the length is not limited to such a length. Several types of longer profiles 12 may be prepared in advance so that they can be applied to the widths of various types of doors, and a profile 12 whose length is slightly longer than the actual width of the door may be selected and the excess in length may be cut off at the installation site.

For example, if the swing door 20 has a wide width and the profile 12 is also long, in order to detect a human body or the like in the vicinity of an edge 20a of the swing door 20 reliably, it is preferable to arrange, within the profile 12, the sensor module 11 as close as possible to the edge 20a of the swing door 20 (which corresponds to the case where only the leftmost sensor module 11 is used among the sensor modules 11 illustrated in FIG. 3).

Also, as illustrated in FIG. 3, the profile 12 is configured to be able to accommodate internally two or more sensor modules 11 so as to be arranged in line in the longitudinal direction at an appropriate interval. At this time, one sensor module 11 (e.g., the sensor module 11 that is nearest to the hinge side 20b of the swing door 20) is assumed to be a master module 11A, and its output signal is connected to the door controller. Other sensor modules 11 are assumed to be slave modules 11B, and are connected to the master module 11A directly or via another slave module 11B. With this measure, even in the case of the swing door 20 that has a wide width, it is possible to detect a human body or an object in the vicinity of the swing door 20 reliably by combining detection areas All that are formed by the plurality of sensor modules 11.

The front cover 13 is a member having a curved plate shape that can be fitted in the rail portions provided inside of the upper and lower ends of the profile 12 and is thereby fixed thereto.

This front cover 13 is made from a material that is transmissive to infra-red rays for use for detection of a human body or an object performed by the sensor module 11, and can also serve as a detection window for the sensor module 11. The front cover 13 has a length in the longitudinal direction that is slightly shorter than that of the profile 12, and the assembly in which the front cover 13 is joined to the later-described LED module 14 and spacer 15 has a length that is the same as that of the profile 12.

The LED module 14 is an example of the "functionality expansion module", which is a feature of the present invention, and is configured to expand functionalities of the automatic door sensor 10 by communicating with the sensor module 11 accommodated within the profile 12. Specifically, this LED module 14 includes a display control circuit 14x (which will be described later with reference to FIG. 4) that is electrically connected to the sensor module 11 via a communication cable or the like and performs display according to an output signal of the sensor module 11.

Note that the term "communication" used in the invention of the present application has a broad meaning of one-way or two-way communication of information, data, or the like, and includes from very simple one-way communication, as with the case of the display control circuit 14x for example, to advanced two-way communication according to a predetermined communication protocol.

The LED module 14 has an external shape that is substantially similar to (but slightly larger than) that of the front cover 13. However, the LED module 14 does not necessarily have such an external shape, but it is preferable that the external surface of the entire automatic door sensor 10 have a smallest possible difference in level among the LED module 14, the left end cover 16L, and right end cover 16R, as illustrated also in FIG. 1(a).

Also, the LED module 14 has on its inside a structure (not shown) whose left and right sides can respectively be joined to the front cover 13 and the spacer 15. For example, grooves or the like each having a constant depth may be provided inside of both left and right ends of the LED module 14, the grooves each enabling the internal surfaces of both left and right ends of the LED module 14 to come in close contact with the external surfaces of the side edges of the front cover 13 and the spacer 15 at a constant width, so as to fix the side edge tips of the front cover 13 and the spacer 15 thereto. However, the structure is not limited to such a structure. Accordingly, for example as illustrated in FIGS. 1(a), 1(b), and 2, by joining the front cover 13 to the right side of the LED module 14 and the spacer 15 to the left side thereof, it is possible to arrange the LED module 14 near the left end of the automatic door sensor 10. Conversely, by joining the front cover 13 to the left side of the LED module 14 and the spacer 15 to the right side thereof, it is also possible to arrange the LED module 14 near the right end of the automatic door sensor 10.

In substantially the center of the external surface of the LED module 14, two LEDs 14a1 and 14a2 for display are arranged adjacently one above the other. Here, an LED that can change its luminescent color (for example, an LED that emits light with red color or green color) is used so as to be able to display much information with a small number of LEDs. However, the LED is not limited to such an example and a combination of monochromatic LEDs (for example, a red LED or green LED), for example, may be used.

The spacer 15 is a member having a very small width and a curved plate shape that has, at least at the left end portion and right end portion thereof, substantially the same cross-sectional shape as that of the front cover 13, and can be joined to either side, i.e., the left or right side, of the LED module 14. This spacer 15 is configured to have a width that is at least shorter than the width of the LED module 14. More specifically, as illustrated also in FIG. 1(a), it is preferable that the automatic door sensor 10 as a whole has a smallest possible gap between the LED module 14 and the left end cover 16L. However, the length is not necessarily limited to such a small width.

The left end cover 16L and the right end cover 16R are fixed by screws or the like so as to close ends of the assembly of the LED module 14 either one of whose left and right sides is joined to the front cover 13 and the other side of which is joined to the spacer 15, and the profile 12 in front of which all these components are inserted.

Note that the assembly in which the front cover 13 is joined to either one of the left side and the right side of the LED module 14 and the spacer 15 is joined to the other side thereof has the same length as the length of the profile 12. Also, the assembly has, at both ends thereof, the same cross-sectional shape as that of the profile 12. This is because the spacer 15 has substantially the same cross-sectional shape as that of the front cover 13. Therefore, in the cases where the front cover 13 is joined to the right side of the LED module 14 and the spacer 15 to the left side thereof (see FIGS. 1(a) and 2), and conversely where the front cover 13 is joined to the left side of the LED module 14 and the spacer 15 to the right side thereof, the left end cover 16L and the right end cover 16R can be used in common.

1.2 Schematic Electrical Configuration of the LED Module 14

Figure 4:
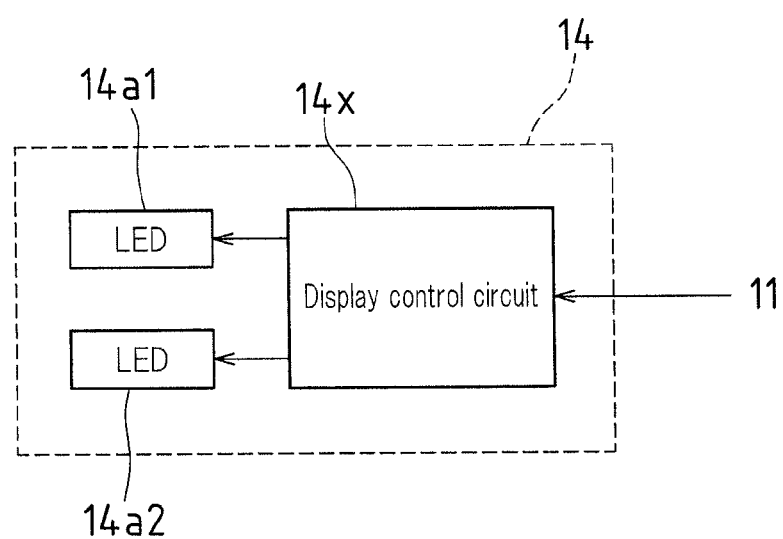
[FIG. 4]

FIG. 4 is a block diagram schematically illustrating an electrical configuration of the LED module 14.

As illustrated in this FIG. 4, the LED module 14 includes, in addition to the above-described two LEDs 14a1 and 14a2, the display control circuit 14x that communicates with the sensor module 11 and thereby recognizes an output signal from the sensor module 11. This display control circuit 14x controls light emission of the LEDs 14a1 and 14a2 on the basis of the output signal from the sensor module 11 so as to change a display mode according to a human body etc. detection state. Examples of the change of the display mode include state switching such as light-turning-on, light-blinking (including change in the blink speed), or light-turning-off, or a change in the luminescent color, but the change is not limited to this example. More specific display examples will be described later.

This display control circuit 14x may be configured in combination with, for example, a general-purpose logic IC and the like or constituted by a CPU to be integrated into equipment and a software for controlling the CPU. Also, by making replacement of such a display control circuit 14x easy or enabling the software for controlling the CPU to be rewritten, it is possible to make a display object or display mode of display performed by the LEDs 14a1 and 14a2 changeable. Alternatively, a display control circuit 14x or the like may store therein in advance a plurality of combinations of a display object, a display mode, and the like, and the combinations may be easily switchable.

However, the display control circuit 14x is not limited to this configuration.

1.3 Examples of Operation Display by the LED Module 14

Hereinafter, some specific examples of operation display by the LED module 14 are shown, but operation display is of course not limited to these.

Figure 5:
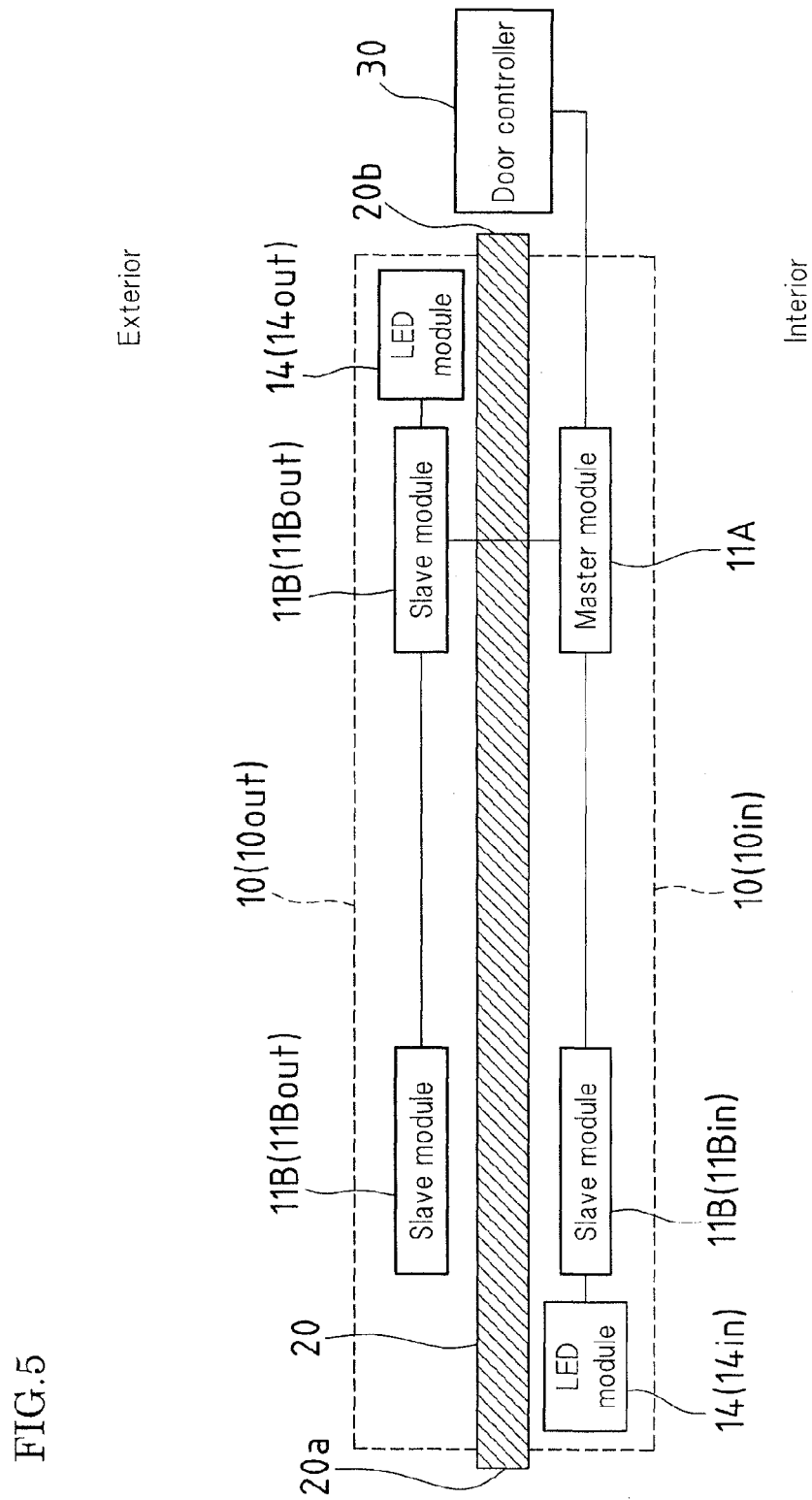
[FIG. 5]

(A) Automatic Door Sensors 10 are Installed on Both Sides of the Door:

FIG. 5 is a block diagram illustrating a schematic configuration in which automatic door sensors 10 are installed on both surfaces of the swing door 20.

As illustrated in this FIG. 5, in the automatic door sensor 10 that is installed on an interior side (the lower side of FIG. 5) of the swing door 20 at the doorway of a room or the like (hereinafter referred to as "automatic door sensor 10in" if differentiation is needed), the master module 11A is arranged closer to the hinge side 20b, the slave module 11B (hereinafter referred to as "slave module 11Bin" if differentiation is needed) is arranged closer to the edge 20a, and the LED module 14 (hereinafter referred to as "LED module 14in" if differentiation is needed) is arranged closer to the edge 20a. These master module 11A, slave module 11B, and LED module 14in are connected to one another, and the master module 11A is further connected to the door controller 30.

In the automatic door sensor 10 that is installed on an exterior side (the upper side in FIG. 5) of the swing door 20 (hereinafter referred to as "automatic door sensor 10out" if differentiation is needed), the slave modules 11B (hereinafter referred to as "slave module 11Bout" if differentiation is needed) are arranged closer to the hinge side 20b and the edge 20a, respectively, and the LED module 14 (hereinafter referred to as "LED module 14out" if differentiation is needed) is further arranged on the hinge side 20b. Also, the slave module 11B arranged closer to the hinge side 20b is connected to the master module 11A arranged on an opposite surface of the swing door 20 (the lower side in FIG. 5) via a wiring passing through a throughhole provided in the swing door 20.

In the LED module 14in on the interior side, a human body etc. detection state of the automatic door sensor 10in arranged on the interior side is displayed with a luminescent color of the LED 14a2, and a human body etc. detection state of the automatic door sensor 10out arranged on an opposite side (on the exterior side) of the swing door 20 or the like is displayed with a luminescent color of the LED 14a1.

Specifically, when neither the master module 11A nor the slave module 11Bin of the automatic door sensor 10in arranged on the interior side has detected a human body or the like, the LED 14a2 emits light with green color, and when either one of the master module 11A and the slave module 11B has detected a human body or the like, the LED 14a2 emits light with red color. Also, neither of two slave modules 11Bout of the automatic door sensor 10out arranged on the exterior side have detected a human body or the like, the LED 14a1 emits light with green color, and when either one of two slave modules 11Bout has detected a human body or the like, the LED 14a2 emits light with red color.

Similarly, also in the LED module 14out arranged on the exterior side, a human body etc. detection state of the automatic door sensor 10out arranged on the exterior side is displayed with a luminescent color of the LED 14a2, and a human body etc. detection state of the automatic door sensor 10in arranged on the opposite side (the interior side) of the swing door 20 is displayed with a luminescent color of the LED 14a1.

By performing such operation display, even when the automatic door sensor 10 is covered with the front cover 13, it is possible to view easily and reliably whether or not the master module 11A or the slave module 11B that is accommodated within the automatic door sensor 10 is operating properly (whether or not a failure or the like has occurred). Further, even while a human stays in a room, it is possible to check whether not only the automatic door sensor 10in arranged on the interior side but also the automatic door sensor 10out arranged on the exterior side is operating properly, simultaneously. Also when a human stays on the exterior side, it is possible to check whether not only the automatic door sensor 10out arranged on the exterior side but also the automatic door sensor 10in arranged on the interior side is operating properly, simultaneously.

Note that the display may be performed using, in addition to the change in the luminescent color of the LEDs 14a1 and 14a2 (or instead of the change in the luminescent color), continuous lighting, blink, or the like.

(B) The Automatic Door Sensor 10 is Installed on Only One Side of the Door:

When the automatic door sensor 10 is installed on only one side of the door and includes only one sensor module 11 accommodated within the automatic door sensor 10, either one of the LEDs 14a1 and 14a2, for example, is used so as to emit light with green color when this sensor module 11 has not detected a human body or the like, and to emit light with red color when this sensor module 11 has detected a human body or the like.

With this, even when the automatic door sensor 10 is covered with the front cover 13, it is possible to view easily and reliably whether or not the sensor module 11 accommodated within automatic door sensor 10 is operating properly (whether or not a failure or the like has occurred).

Note that, for example, if both the LEDs 14a1 and 14a2 are monochromatic LEDs, in which the LED 14a1 emits light with a luminescent color of red and the LED 14a2 emits light with a luminescent color of green, a configuration is also possible in which only the LED 14a2 emits light when the sensor module 11 has not detected a human body or the like, and only the LED 14a1 emits light when the sensor module 11 has detected a human body or the like.

Also, if the automatic door sensor 10 that is installed on only one side of the door includes two sensor modules 11 accommodated within the automatic door sensor 10, for example, the LED 14a1 may emit light with green color if one sensor module 11 has not detected a human body or the like, and the LED 14a1 may emit light with red color if the one sensor module 11 has detected a human body or the like. The LED 14a2 emits light with green color if the other sensor module 11 has not detected a human body or the like, and the LED 14a2 emits light with red color if the other sensor module 11 has detected a human body or the like.

Accordingly, even when the automatic door sensor 10 is covered with the front cover 13, it is possible to view easily and reliably whether or not the two sensor modules 11 accommodated within the automatic door sensor 10 are operating properly, individually.

According to the above-described first embodiment, even when the automatic door sensor 10 is covered with the front cover 13, it is possible to view easily and reliably whether or not the sensor module 11 accommodated within the automatic door sensor 10 is operating properly (whether or not a failure or the like has occurred). Further, for example, if the automatic door sensors 10 are installed on both sides of the door at the doorway of a room or the like, it is possible to check, while a human stays in a room, whether or not the automatic door sensors 10 on the interior side and the exterior side are operating properly, simultaneously.

Second Embodiment

Hereinafter, the case in which the LED module 14 of the first embodiment is replaced by a learning manipulation module 14A, which is capable of solving the problem (2) among the above-described problems of the conventional triangulation safety sensor 110, will be described as a second embodiment.

Figure 6:
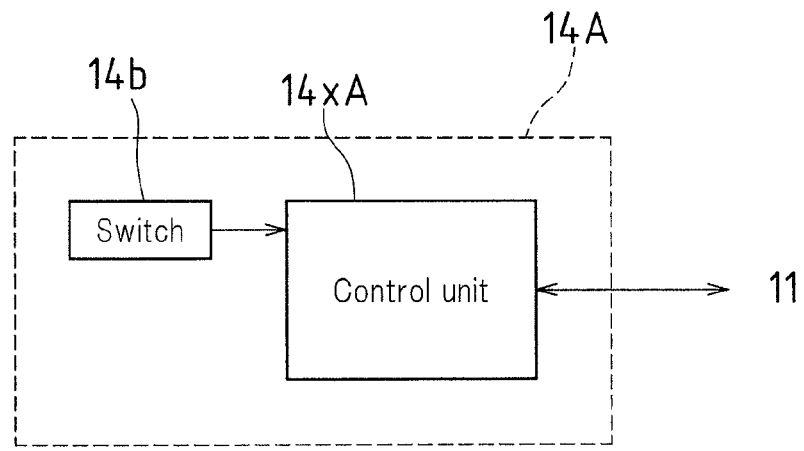
[FIG. 6]

FIG. 6 is a block diagram schematically illustrating an electrical configuration of the learning manipulation module 14A.

As illustrated in this FIG. 6, the learning manipulation module 14A includes: a switch (learning start button) serving as a manipulation unit that is externally manipulatable by a builder or an client; and a control unit 14xA for performing two-way communication with the sensor module 11 and thereby transmitting an instruction to the sensor module 11 so as to cause it to execute a predetermined operation. Here, the predetermined operation refers to "operation for learning a cancellation distance from the floor", however, the sensor module 11 may be caused to execute other adjustment operation, setting operation, or the like. Note that although this control unit 14xA may essentially have a similar configuration to that of the control unit 14x of the first embodiment, the contents or the like of specific control logic and control software can be changed if needed.

According to such a second embodiment, it is possible to cause the sensor module 11 to learn a cancellation distance of the installation location from the floor, with the automatic door sensor 10 in which the sensor module 11 is accommodated being covered with the front cover 13 (detection window). Accordingly, an error that may be caused depending on the presence or absence of the front cover 13 can be solved.

Note that even in the case of the functionality expansion module specialized in such a functionality, it is not very preferable that anyone can easily operate the switch. For example, it is conceivable that someone does mischief on the functionality expansion module, and a builder or the like may carelessly come into contact with the switch after the completion of the adjustment work, resulting in a shift in the learned results. Therefore, it is preferable that, as a reset switch of a personal computer, the switch be difficult to be operated without, for example, a special tool such as a needle. Also, since the automatic door sensor 10 may be installed outdoors or the like, the automatic door sensor 10 should have a structure for preventing rain or dust from coming thereinto.

Third Embodiment

Hereinafter, the case in which the LED module 14 of the first embodiment is replaced by a door angle detection module 14B, which is capable of solving the problem (3) among the above-described problems of the conventional triangulation safety sensor 110, will be described as a third embodiment.

Figure 7:
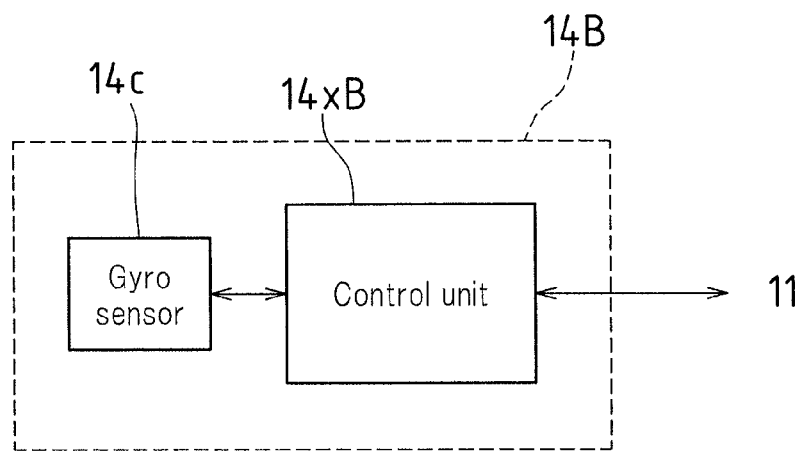
[FIG. 7]
Figure 8:
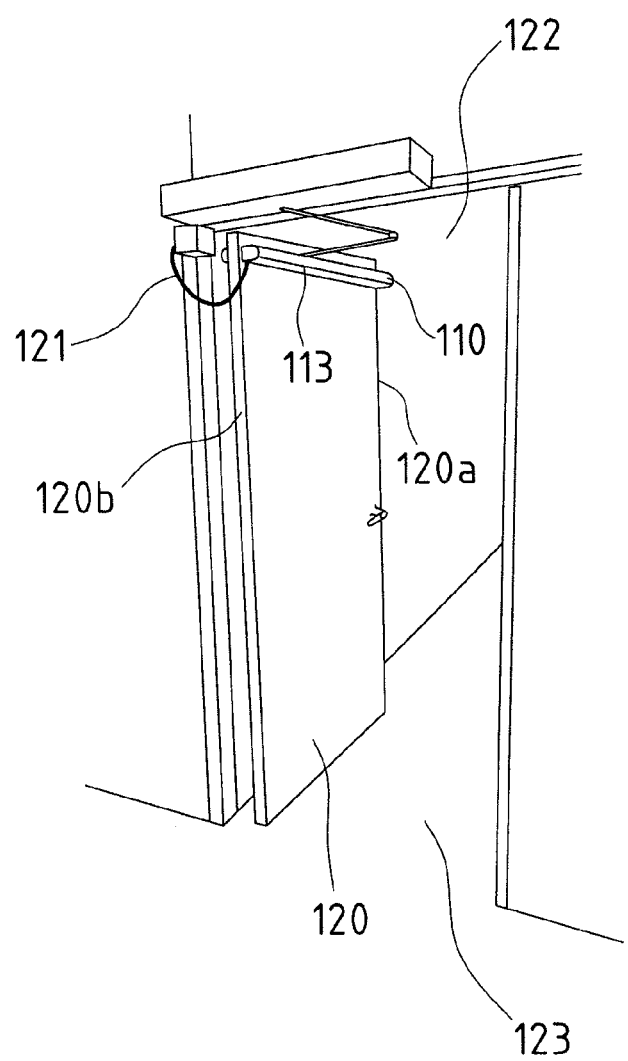
[FIG. 8]

FIG. 7 is a block diagram schematically illustrating an electrical configuration of the door angle detection module 14B.

As illustrated in FIG. 7, the door angle detection module 14B includes: a gyro sensor 14c serving as a detection unit that can recognize and detect angular information, positional information, inclination information, acceleration information, or the like when a swing door or the like to which the automatic door sensor 10 is installed opens; and a control unit 14xB for communicating with the sensor module 11 according to the various types of information detected by this gyro sensor 14c (e.g., if there is a change in a predetermined angle or more) so as to transmit an instruction to cancel the state in which a human body or an object is detected. Note that although this control unit 14xB may essentially have a similar configuration to that of the control unit 14x of the first embodiment or that of the learning manipulation module 14A of the second embodiment, the contents or the like of specific control logic and control software can be changed if needed.

According to the third embodiment as above, even if the door controller has no detection cancellation functionality, it is easily possible to attain prevention of malfunction (e.g., the swing door does not fully open) that may be caused due to a wall or the like located at the position where the swing door to which the automatic door sensor 10 is installed fully opens, without installing a magnet switch or the like or performing troublesome adjustment works or the like.

Other Embodiments

Besides the above-described embodiments, a functionality expansion module is also conceivable that has, for example, a sound generation functionality and determines that a human is actually present, for example, when the sensor module 11 is detecting a human body or the like for a predetermined period of time or more, so as to generate a warning sound for urging the human to go away.

It is also possible to make two or more different functionality expansion modules simultaneously available. For example, the functionality expansion modules are joined to each other with the spacer 15 or a similar joining member for example, and a little shorter front cover 13 may be used instead. Similarly, one functionality expansion module may be arranged on each end of the automatic door sensor 10 and a little shorter front cover 13 may be used instead.

Alternatively, if the functionality expansion module is not particularly needed, the front cover 13 may be replaced by a front cover 13 that has the same length as that of the profile 12.

The present invention can be embodied in other forms without departing from the spirit or essential characteristics thereof. The foregoing embodiments are therefore to be considered in all respects as illustrative and not restrictive. The scope of the invention is indicated by the appended claims rather than by the foregoing description. Furthermore, all modifications and changes that come within the meaning and range of equivalency of the claims are intended to be embraced therein.

This application claims priority based on Patent Application No. 2010-243633 filed in Japan on Oct. 29, 2010, the entire contents of which are herein incorporated by reference. Also, documents cited in the present description are herein incorporated by reference in its entirely.

| Descriptions of Reference Numerals | |
|---|---|
| 10 | Automatic door sensor |
| 11 | Sensor module <Sensor module unit> |
| A11 | Detection area |
| 11a | Projector lens |
| 11b | Pair of receiving lenses |
| 11c | Operation displaying LED |
| 11d | DIP switch |
| 12 | Profile <Accommodation unit> |
| 13 | Front cover <Cover member> |
| 14 | LED module <Functionality expansion module> |
| 14A | Learning manipulation module <Functionality expansion module> |
| 14B | Door angle detection module <Functionality expansion module> |
| 14a1 | LED <Display unit, Light emitting element> |
| 14a2 | LED <Display unit, Light emitting element> |
| 14b | Switch <Manipulatable unit> |
| 14c | Gyro sensor <Detection unit> |
| 14x | Display control circuit <Control unit> |
| 14xA | Control unit <Control unit> |
| 14xB | Control unit <Control unit> |
| 15 | Spacer <Joining member> |
| 16L | Left end cover <Cap portion> |
| 16R | Right end cover <Cap portion> |
| 20 | Swing door |
| 30 | Door controller |
| 110 | Triangulation safety sensor |
| 113 | Detection window |
| 120 | Swing door |
| 121 | Wiring |
| 122 | Wall |
| 123 | Floor |

The invention claimed is:

1. An automatic door sensor comprising:
   at least one sensor module unit configured to detect optically an object or a human body and to output, according to detection results, a signal to a door controller for controlling an automatic door to open/close;
   an accommodation unit that is capable of accommodating the at least one sensor module unit;
   a cover member that is transmissive to light for use for the detection performed by the sensor module unit and configured to cover the accommodation unit in which the sensor module unit is accommodated; and
   a functionality expansion module either side of which can be joined to the cover member and that is configured to expand functionalities of the automatic door sensor by performing one-way or two-way communication with the sensor module unit.

2. The automatic door sensor according to claim 1, further comprising:
   a joining member that can be joined to either side of the functionality expansion module; and
   a pair of cap portions for closing both ends of the accommodation unit covered with the functionality expansion module one side of which is joined to the cover member and the other side of which is joined to the joining member;
   wherein the accommodation unit is capable of internally accommodating the sensor module unit, and
   the functionality expansion module is electrically connected to the sensor module unit so as to perform the communication with the sensor module unit.

3. The automatic door sensor according to claim 2,
   wherein the accommodation unit is open at both ends and in a direction of one side, and is capable of accommodating the at least one sensor module unit so as to be arranged in a longitudinal direction thereof,
   the cover member has a curved plate shape, and is fittable in the direction of one side of the accommodation unit,
   the joining member has substantially a same cross-sectional shape as that of the cover member at least at both ends of the joining member, and has a width that is less than a width of the functionality expansion module, and
   the functionality expansion module one side of which is joined to the cover member and the other side of which is joined to the joining member as a whole has a length that is substantially a same as a length of the accommodation unit.

4. The automatic door sensor according to claim 1,
   wherein the functionality expansion module further includes a display unit for performing visible display, and
   the control unit is configured to control the display performed by the display unit according to a human body or object detection state of the sensor module unit.

5. The automatic door sensor according to claim 4,
   wherein the control unit changes a mode of display performed by the display unit between a state in which a human body or an object is detected by the automatic door sensor and a state in which no human body or object is detected by the automatic door sensor.

6. The automatic door sensor according to claim 4,
   wherein the display unit includes a plurality of light emitting elements, and
   the control unit controls light emission of each of the light emitting elements according to human body or object detection states of a plurality of automatic door sensors.

7. The automatic door sensor according to claim 6,
   wherein each light emitting element emits light in a variable luminescent color, and
   the control unit changes the luminescent color of the light emitting element between the state in which a human body or an object is detected by the automatic door sensor and the state in which no human body or object is detected.

8. The automatic door sensor according to claim 6,
   wherein at least one of the plurality of automatic door sensors is installed on a surface of a door that is opposite to a surface on which another automatic door sensor is installed.

9. The automatic door sensor according to claim 1,
wherein the functionality expansion module further includes a manipulation unit that is externally manipulatable, and
the control unit causes the sensor module unit to perform a predetermined operation in accordance with a manipulation of the manipulation unit.

10. The automatic door sensor according to claim 9,
wherein the predetermined operation is an operation for learning a cancellation distance from a floor at an installation location.

11. The automatic door sensor according to claim 1,
wherein the functionality expansion module further includes a detection unit that is capable of detecting at least one type of information among angular information, positional information, inclination information, and acceleration information, and
the control unit cancels the state in which a human body or an object is detected by the sensor module unit, depending on the information detected by the detection unit.

12. A functionality expansion module for use in an automatic door sensor according to claim 1.

13. The automatic door sensor according to claim 2,
wherein the functionality expansion module further includes a display unit for performing visible display, and
the control unit is configured to control the display performed by the display unit according to a human body or object detection state of the sensor module unit.

14. The automatic door sensor according to claim 3,
wherein the functionality expansion module further includes a display unit for performing visible display, and
the control unit is configured to control the display performed by the display unit according to a human body or object detection state of the sensor module unit.

15. The automatic door sensor according to claim 13,
wherein the control unit changes a mode of display performed by the display unit between a state in which a human body or an object is detected by the automatic door sensor and a state in which no human body or object is detected by the automatic door sensor.

16. The automatic door sensor according to claim 14,
wherein the control unit changes a mode of display performed by the display unit between a state in which a human body or an object is detected by the automatic door sensor and a state in which no human body or object is detected by the automatic door sensor.

17. The automatic door sensor according to claim 5,
wherein the display unit includes a plurality of light emitting elements, and
the control unit controls light emission of each of the light emitting elements according to human body or object detection states of a plurality of automatic door sensors.

18. The automatic door sensor according to claim 13,
wherein the display unit includes a plurality of light emitting elements, and
the control unit controls light emission of each of the light emitting elements according to human body or object detection states of a plurality of automatic door sensors.

19. The automatic door sensor according to claim 14,
wherein the display unit includes a plurality of light emitting elements, and
the control unit controls light emission of each of the light emitting elements according to human body or object detection states of a plurality of automatic door sensors.

20. The automatic door sensor according to claim 15,
wherein the display unit includes a plurality of light emitting elements, and
the control unit controls light emission of each of the light emitting elements according to human body or object detection states of a plurality of automatic door sensors.

* * * * *